United States Patent [19]

Kimura

[11] Patent Number: 5,107,164

[45] Date of Patent: Apr. 21, 1992

[54] LENGTH-EXTENTIONAL QUARTZ RESONATOR

[75] Inventor: Fumio Kimura, Sendai, Japan

[73] Assignee: Seiko Electronic Components Ltd., Japan

[21] Appl. No.: 355,152

[22] Filed: May 22, 1989

[30] Foreign Application Priority Data

May 20, 1988 [JP] Japan .................. 63-124545

[51] Int. Cl.$^5$ ............................................. H01L 41/08
[52] U.S. Cl. ........................................ 310/367; 310/368
[58] Field of Search ................ 310/360, 361, 367, 368

[56] References Cited

U.S. PATENT DOCUMENTS

| 4,139,793 | 2/1979 | Michel | 310/367 X |
| 4,216,402 | 8/1980 | Engdahl | 310/368 X |
| 4,608,510 | 8/1986 | Dinger et al. | 310/361 |

FOREIGN PATENT DOCUMENTS

| 0096653 | 12/1983 | European Pat. Off. | 310/367 |
| 0052621 | 4/1980 | Japan | 310/346 |
| 0037722 | 3/1984 | Japan | 310/367 |
| 0216313 | 12/1984 | Japan | 310/367 |
| 0070810 | 4/1985 | Japan | 310/367 |

Primary Examiner—Mark O. Budd
Attorney, Agent, or Firm—Bruce L. Adams; Van C. Wilks

[57] ABSTRACT

A length-extentional quartz resonator has a pair of linearly arranged longitudinal oscillating portions supported to undergo dominant length-extentional oscillation having an oscillating frequency in the range from 1.04 MHz to 1.06 MHz. A rectangular frame member is arranged to support and surround the oscillating portions and has the outer overall length of 4000 μm ±200 μm. The frame member has a pair of longitudinal frame portions connected to the oscillating portions through transverse support portions to undergo flexual oscillation, and having width set in the range from 110 μm to 260 μm effective to suppress coupling between the dominant length-extentional oscillation and the flexual oscillation.

11 Claims, 3 Drawing Sheets

LENGTH-EXTENTIONAL QUARTZ RESONATOR

BACKGROUND OF THE INVENTION

The present invention relates to a length-extentional quartz resonator having an oscillating frequency range of 1.04 MHz to 1.06 MHz, and used in an information processing device and a communication device such as a microcomputer and a wireless telephone, and more specifically relates to a dimensional arrangement thereof to improve its performance.

The length-extentional quartz resonator is designed to undergo dominant length-extentional oscillation accompanied with suprious flexual oscillations. The specific frequencies of dominant and suprious oscillations are determined according to the dimensional parameters of the resonator. When a suprious oscillation is coupled with or resonated to the dominant oscillation, the equivalent resistance of the resonator is abruptly increased to thereby impair the performance of the resonator.

SUMMARY OF THE INVENTION

An object of the present invention is to, therefore, set the dimensional parameter of a length-extentional quartz resonator properly to avoid coupling between the dominant and suprious oscillations to thereby ensure the stable oscillatory performance of the resonator.

DETAILED DESCRIPTION OF THE INVENTION

Figure 1:
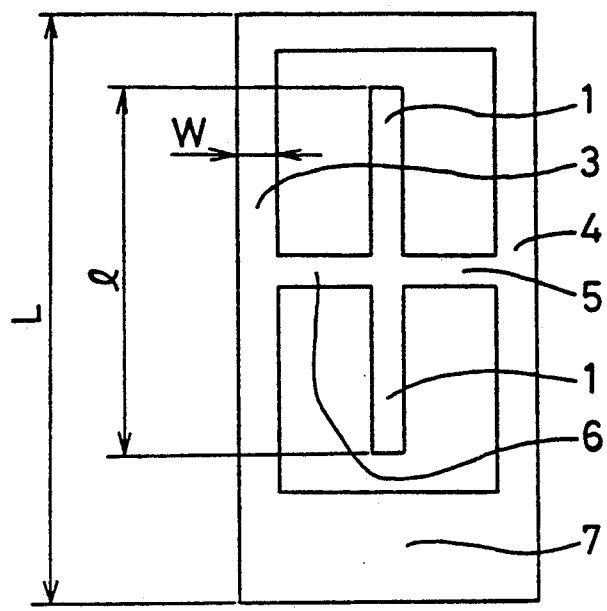
FIG. 1 is a plan view of the length-extentional quartz resonator.

FIG. 1 is a plan view showing a shape of the length-extentional quartz resonator. The resonator is comprised of a pair of oscillating portions 1 linearly arranged to each other, and a pair of frame portions 3 and 4 which surround the oscillating portions 1 and which are formed integrally with a base or mounting portion 7. The pair of oscillating portions 1 are centrally arranged between the opposite frame portions 3 and 4, and are connected at their junction to the respective frame portions 3 and 4 through a pair of crossing or transverse supporting portions 5 and 6 formed integrally with other portions of the resonator. Such shape of the length-extentional quartz resonator is formed by an etching method with photolithography from quartz wafer. As shown in the FIGURE, the lengthwise aligned oscillating portions 1 are surrounded by the frame portions and mounting portion. Further, the pair of frame portions 3 and 4 are preferably connected at their free ends to each other through a bridge portion to thereby define a rectangular outer shape of the length-extentional quartz resonator.

Figure 2:
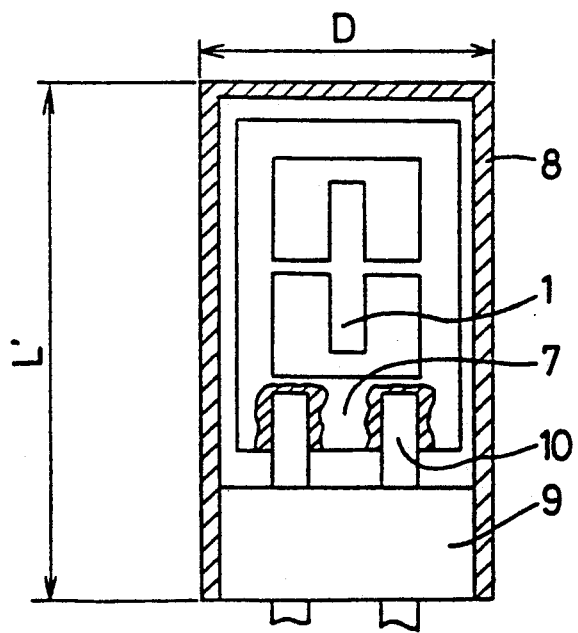
FIG. 2 is a sectional view of the package of the length-extentional quartz resonator.

FIG. 2 is a sectional view of a package accommodating therein the length-extentional quartz resonator. The package is comprised of a cylindrical metal container or cap 8 having diameter of 2 mm and length of 6 mm. The cap 8 has a closed top end portion and an open bottom end portion which is closed by a stem 9. The length-extentional quartz resonator is mounted inside the cap 8 by means of a pair of lead members 10. The lead members 10 are fixed at their one ends to the base or mounting portion 7 of the resonator by solder or electroconductive adhesive, and extend outwardly of the cap 8 through the stem 9 for electrical connection to outside.

The specific frequency of dominant oscillation of the length-extentional quartz resonator is determined according to the total length l (FIG. 1) of linearly arranged oscillating portions 1 as represented by the following relation (1):

$$f(KHz) = \frac{2740 \ (KHz \cdot mm)}{l(mm)} \qquad (1)$$

Further, as indicated by FIG. 2, the container 8 is designed in a typical shape and dimension for practical and general purpose of use such that the container 8 has a cylindrical shape with outer diameter D of 2.0 mm and the length L' of 6.0 mm. In view of this package dimensional limitation, the entire length L of the rectangular resonator is necessarily limited to L=4000 $\mu m \pm 200 \ \mu m$ as shown in FIGS. 1 and 2.

Figure 3:
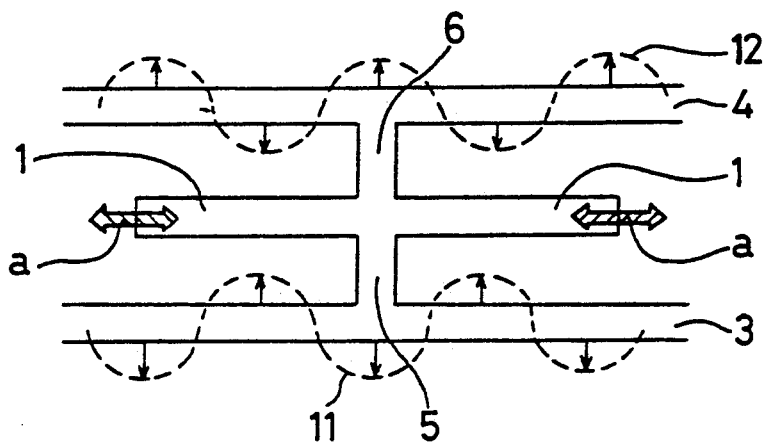
FIG. 3 is a partial plan view of the length-extentional quartz resonator, schematically illustrating its oscillation modes of dominant length-extentional oscillation and accompanied flexual oscillation.

FIG. 3 shows oscillation modes of the length-extentional quartz resonator shown in FIG. 1. As shown, the resonator is comprised of a pair of longitudinal oscillating portions 1 linearly arranged to each other, a pair of longitudinal frame portions 3 and 4 opposed in parallel to each other with respect to the oscillating portions 1, and a pair of transverse supporting portions 5 and 6, each connecting between each frame portion and the mid junction of the pair of oscillating portions 1. The oscillating portions 1 undergo dominant length-extentional oscillation displacement as indicated by the double headed arrows $\bar{a}$.

This displacement $\bar{a}$ is transmitted through the supporting portions 5 and 6 to the respective longitudinal frame portions 3 and 4 to induce thereon flexual oscillations as illustrated by the dashed lines 11 and 12.

The specific frequency f of dominant oscillation of the oscillating portions 1 is determined according to the relation (1) in the FIG. 3 embodiment. Consequently, the frame portions 3 and 4 tend to undergo the flexual oscillations at a frequency identical to the specific frequency f of the oscillating portions 1. However, the frame portions 3 and 4 have their own specific frequency for the flexual oscillation independently from the oscillating portions 1. If the specific frequency of frame portions 3 and 4 substantially coincides with that of pure length-extentional oscillation of the oscillating portions 1, the equivalent resistance $R_1$ of the resonator is abruptly increased due to resonance to thereby cause a serious problem. Such phenomenon is similar to the coupling phenomenon between dominant oscillation and suprious oscillation, which is observed in other types of quartz resonators, for example, typically in the AT cut quartz resonator.

However, with regard to the length-extentional quartz resonator, the theoretical or experimental analysis has not yet been undertaken for specific frequency of the suprious flexual oscillations of the frame portion. There has been no design rule of the length-extentional quartz resonator effective to avoid the suprious, and there has been a serious problem that the equivalent resistance $R_1$ of the resonator is abruptly increased due to the suprious. Therefore, it is particularly important to analyze the quantitative relation between the specific frequency of suprious oscillation of the frame portion and the specific frequency of the dominant length-extentional oscillation of the main oscillating portion in terms of dimensional parameter of the resonator so as to enable proper setting of the dimensional parameter effective to suppress the ill suprious phenomenon.

According to the present invention, the quantitative and numerical relation between the specific flexual oscillation of the frame portion and the dominant length-extentional oscillation of the main oscillating portion is made clear through the experimental method. Based on the experimental result, the dimensional parameter of resonator is determined so as to stabilize or improve the equivalent resistance characteristic of the length-extentional quartz resonator.

Figure 4:
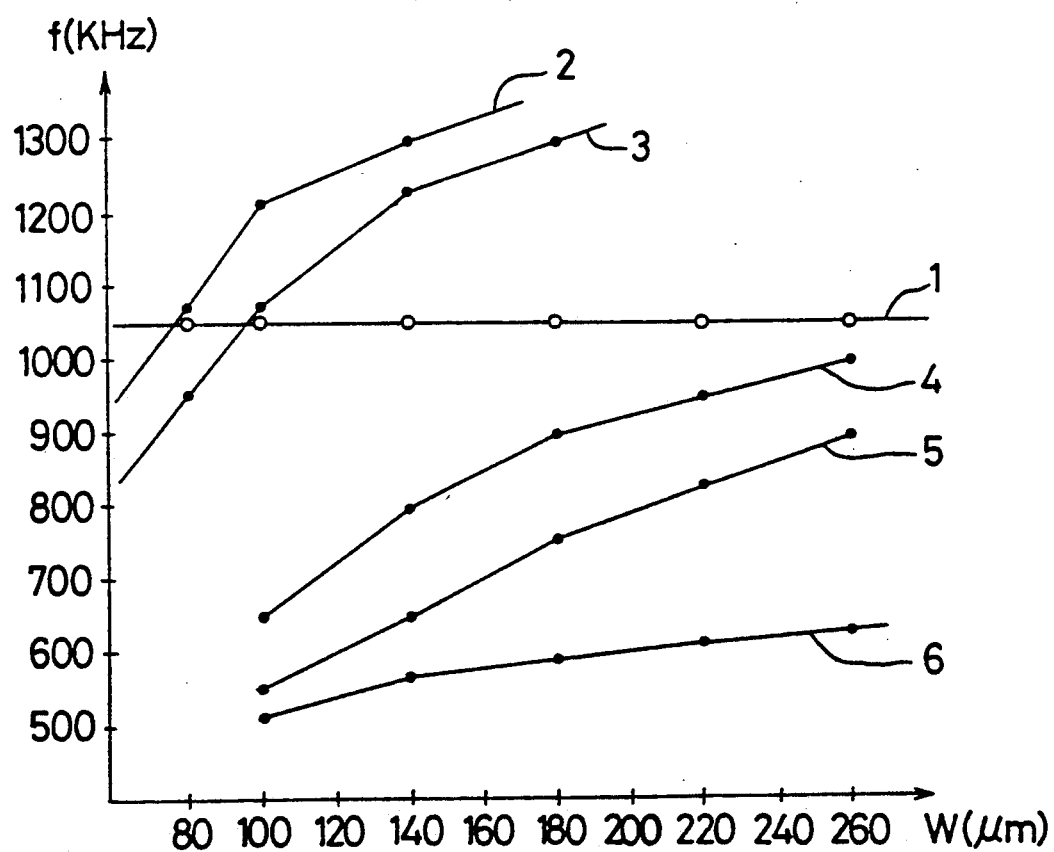
FIG. 4 is a diagram showing frequency relations between the dominant length-extentional oscillation and the suprious frame flexual oscillations.

FIG. 4 is a diagram showing the experimental relation between the dominant frequency of length-extentional oscillation and the suprious frequencies of the frame portion, obtained by varying the width W of longitudinal frame portions 3 and 4 of the length-extentional quartz resonator shown in FIG. 1. The curve 1 indicates the change of dominant frequency f in terms of the width W of the frame portion. As shown, the dominant frequency f is substantially kept constant when the width W is changed. The dominant frequency f is typically 1.05 MHz in this embodiment. The curves 2–6 indicate the changes of various suprious frequencies $f_s^1$–$f_s^6$ in terms of the width W of the frame portion. The experimentally obtained result indicated by FIG. 4 can be effectively applied to the length-extentional quartz resonator having the entire length L of 4000 $\mu m \pm 200$ $\mu m$ and the combined length l of the main oscillating portions of 2585 $\mu m$ to 2635 $\mu m$. For the range of combined length l from 2585 $\mu m$ to 2635 $\mu m$, the length-extentional quartz resonator undergoes the length-extentional oscillation at the frequency of about 1.040 MHz to 1.060 MHz.

In FIG. 4, the suprious frequencies $f_s^2$ and $f_s^1$ indicated by the curves 3 and 2, respectively, have the same value as the dominant frequency f in the range of the width W from 80 $\mu m$ to 100 $\mu m$. Further, in the range of width W above 260 $\mu m$, the suprious frequencies $f_s^3$, $f_s^4$ and $f_s^6$ approach the dominant frequency f as indicated by the curves 4, 5 and 6, respectively. Namely, a specific frequency of some suprious flexual oscillation of the frame portion coincides with that of the main oscillating portion in the range of width W between 80 $\mu m$ and 100 $\mu m$ and above 260 $\mu m$ to thereby abruptly increase the equivalent resistance $R_1$. Accordingly, it is found that the width W of the frame portion should be set within the following range (2):

$$110 \ \mu m \leq W \leq 260 \ \mu m \quad (2)$$

According to the present invention, in the length-extentional quartz resonator having the entire length L of 4000 $\mu m \pm 200$ $\mu m$ and the dominant oscillating frequency range from 1040 KHz to 1060 KHz, the width W of frame portions 3 and 4 is set within the range 110 $\mu m \leq W \leq 260$ $\mu m$ to thereby eliminate the suprious due to the resonant flexual oscillation of the frame portions to reduce the equivalent resistance $R_1$ of the resonator.

The length-extentional quartz resonator applied with the present invention has the entire length L of 4000 $\mu m \pm 200$ $\mu m$ and the rectangular outer shape in which the pair of linearly arranged longitudinal oscillating portions are surrounded by the pair of frames 3 and 4.

Figure 5A:
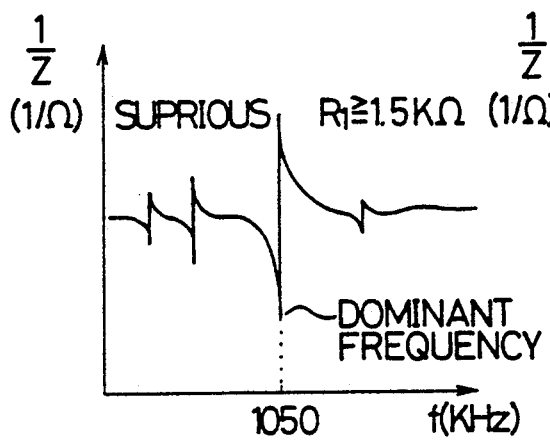
FIG. 5A is a diagram showing a resonant characteristic of the length-extentional quartz resonator not applied with the invention.
Figure 5B:
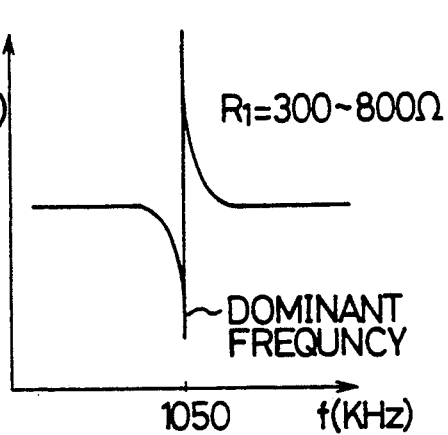
FIG. 5B is a diagram showing a resonant characteristic of the length-extentional quartz resonator according to the invention.

FIG. 5A shows the resonant characteristic of the length-extentional quartz resonator not applied with the present invention. Namely, the width dimension of the frame portion is set outside the optimum range determined according to the invention, and the resonator has a plurality of resonant frequencies due to the suprious. On the other hand, FIG. 5B shows the resonant characteristic of the length-extentional quartz resonator according to the present invention, in which the width W of the frame portion is set according to the relation (2). In the resonator not applied with the invention, the resonant resistance or equivalent resistance $R_1$ is affected by the suprious and therefore has the value above 1.5 K$\Omega$, whereas in the resonator of FIG. 5B, the resonant resistance $R_1$ has the value of 300$\Omega$ to 800$\Omega$ which is about half of the resonant resistance of the FIG. 5A resonator. As described above, by setting the width dimension of the frame portion within the desired range according to the invention, the optimum resonant resistance characteristic can be obtained.

Figure 6A:
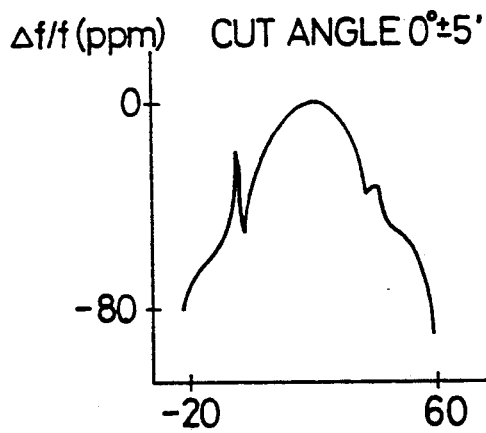
FIG. 6A is a diagram showing a frequency-temperature characteristic of the length-extentional quartz resonator not applied with the invention.
Figure 6B:
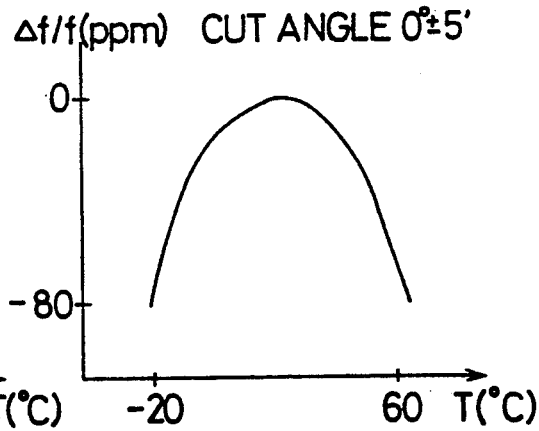
FIG. 6B is a diagram showing a frequency-temperature characteristic of the length-extentional quartz resonator according to the invention.

FIG. 6A shows the frequency-temperature characteristic of the length-extentional quartz resonator not applied with the invention. The frequency-temperature characteristic curve is disturbed due to affect of the suprious. On the other hand, FIG. 6B shows the frequency-temperature characteristic of the length-extentional quartz resonator according to the invention in which the width dimension of the frame portion thereof is set according to the relation (2). The frequency-temperature characteristic curve is not disturbed and the resonator can exhibit good intrinsic temperature characteristic specific to the length-extentional quartz resonator. Thus, not only the optimum equivalent resistance characteristic can be obtained, but also the optimum frequency-temperature characteristic can be obtained according to the present invention.

As described above, according to the present invention, in the length-extentional quartz resonator of oscillating frequency range from 1.04 MHz to 1.06 MHz having main oscillating portions surrounded by frame portions, the width dimension W of the frame portion is set within the range 110 $\mu m \leq W \leq 260$ $\mu m$ to thereby achieve the following remarkable advantages:

(1) By setting the width of the frame portion to the optimum dimension, the coupling of suprious oscillations can be eliminated to reduce the equivalent resistance $R_1$.

(2) The intrinsic desired temperature characteristic can be obtained due to the elimination of coupling of suprious oscillation.

What is claimed is:

1. A length-extentional quartz resonator formed in one body comprising: oscillating means supported to undergo dominant length-extentional oscillation and having an oscillating frequency in the range from 1.04 MHz to 1.06 MHz; frame means having an integral rectangular shape and arranged to surround the oscillating means and having an overall outer length of 4000 $\mu m \pm 200$ $\mu m$, the frame means including a pair of longitudinal frame portions connected to the oscillating means to undergo flexural oscillation and having a width set in the range from 110 $\mu m$ to 260 $\mu m$ effective to suppress spurious coupling between the dominant length-extentional oscillation and the flexural oscillation, and a pair of oppositely positioned arm mans for fastening the oscillating means to the frame means at opposite center points on the oscillating means, the arm means being disposed perpendicularly to the oscillating means and the longitudinal frame portions.

2. A length-extentional quartz resonator according to claim 1;
wherein the oscillating means comprises a pair of longitudinal oscillating portions arranged linearly and connected to each other such that the combined length thereof is set within the range from 2585 $\mu m$ to 2635 $\mu m$ effective to determine the oscillating frequency in the range from 1.04 MHz to 1.06 MHz.

3. A length-extentional quartz resonator according to claim 1; wherein the arm means comprises a pair of support portions extending transversely from the linearly arranged longitudinal oscillating portions in opposite directions for connecting the oscillating portions to the respective supporting portions.

4. A length-extentional quartz resonator according to claim 1; wherein the frame means includes a base portion connected to one of the ends of the respective frame portions, and a bridge portion connected transversely between the other ends of the respective frame portions.

5. A length-extentional quartz resonator according to claim 1; wherein the oscillating means comprises a pair of longitudinal oscillating portions arranged linearly and connected to each other such that the combined length thereof is set within the range from 2585 $\mu m$ to 2635 $\mu m$ effective to determine the oscillating frequency in the range from 1.04 MHz to 1.06 MHz.

6. A length-extentional quartz resonator according to claim 5; wherein the arm means comprises a pair of support portions extending transversely from the linearly arranged longitudinal oscillating portions in opposite directions for connecting the oscillating portions to the respective supporting portions.

7. A quartz resonator comprised of a one-piece plate, comprising: oscillating means configured to undergo dominant length-extentional oscillation at an oscillating frequency in the range from 1.40 to 1.06 MHz and having a central area with two oppositely extending oscillating portions; a frame surrounding the oscillating means and having an overall outer length of 4000 $\mu m \pm 200$ $\mu m$, the frame including a pair of longitudinal frame portions; means connecting the longitudinal frame portions to the central area of the oscillating means to effect flexural oscillation of the longitudinal frame portions; and wherein the width of each longitudinal frame portion is in a range from 110 $\mu m$ to 260 $\mu m$ to suppress spurious coupling between the dominant length-extentional oscillation and the flexural oscillation.

8. The resonator according to claim 7, wherein the connecting means comprises two arms.

9. The resonator according to claim 8, wherein the arms are disposed perpendicular to the oscillating means and the longitudinal frame portions.

10. The resonator according to claim 7, wherein the two oscillating portions are disposed colinearly and connected to each other at the central area and have an overall length in the range from 2585 $\mu m$ to 2635 $\mu m$.

11. The resonator according to claim 7, wherein the frame has a rectangular configuration and further includes parallel base and bridge portions connecting the two longitudinal frame portions.

* * * * *